United States Patent
Douskey et al.

(10) Patent No.: US 10,359,471 B2
(45) Date of Patent: Jul. 23, 2019

(54) IMPLEMENTING DECREASED SCAN DATA INTERDEPENDENCE FOR COMPRESSED PATTERNS IN ON PRODUCT MULTIPLE INPUT SIGNATURE REGISTER (OPMISR) THROUGH SCAN SKEWING

(71) Applicant: International Business Machines Corporation, Armonk, NY (US)

(72) Inventors: Steven M. Douskey, Rochester, MN (US); Michael J. Hamilton, Rochester, MN (US); Amanda R. Kaufer, Rochester, MN (US); Phillip A. Senum, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 15/178,240

(22) Filed: Jun. 9, 2016

(65) Prior Publication Data

US 2017/0356959 A1 Dec. 14, 2017

(51) Int. Cl.
*G01R 31/3177* (2006.01)
*G01R 31/317* (2006.01)
*G01R 31/327* (2006.01)

(52) U.S. Cl.
CPC ... *G01R 31/3177* (2013.01); *G01R 31/31725* (2013.01)

(58) Field of Classification Search
CPC ............ G01R 31/3177; G01R 31/3183; G01R 31/318335; G01R 31/318502;
(Continued)

(56) References Cited

U.S. PATENT DOCUMENTS 3,842,350 A * 10/1974 Gross ..................... H04B 7/208
455/13.1
7,278,075 B2 * 10/2007 Onodera ........ G01R 31/318536
714/726
(Continued)

FOREIGN PATENT DOCUMENTS

| EP | 002128763 A1 | 12/2012 |
|---|---|---|
| WO | WO 2010102228 A1 | 9/2010 |
| WO | WO2011144331 A1 | 11/2011 |

OTHER PUBLICATIONS

Barnhart C, et al; "Extending OPMISR beyond 10x scan test efficiency." IEEE Design & Test of Computers. Sep. 2002 1(5):65-72.

*Primary Examiner* — April Y Blair
*Assistant Examiner* — Dipakkumar B Gandhi
(74) *Attorney, Agent, or Firm* — Joan Pennington

(57) ABSTRACT

A method and circuit for implementing enhanced scan data testing with decreased scan data interdependence for compressed patterns in on product multiple input signature register (OPMISR) testing through scan skewing, and a design structure on which the subject circuit resides are provided. The circuit is divided into multiple chiplets. Each chiplet includes a stump mux structure including multiple stump muxes connected in series, and a respective chiplet select is provided on shared scan inputs to respective chiplets. The chiplet select gates scan clocks, and when a chiplet is not selected the chiplet retains its data. The chiplet select enables test data to be skewed as scan data enters each chiplet.

20 Claims, 5 Drawing Sheets

100

(58) Field of Classification Search
CPC .... G01R 31/318536; G01R 31/318544; G01R 31/31725
See application file for complete search history.

(56) References Cited

U.S. PATENT DOCUMENTS

| | | | |
|---|---|---|---|
| 7,693,676 B1* | 4/2010 | Keller | G01R 31/318575 702/118 |
| 8,468,404 B1* | 6/2013 | Chickermane | G01R 31/318533 714/726 |
| 9,170,301 B1* | 10/2015 | Gallagher | G01R 31/31813 |
| 2003/0036869 A1* | 2/2003 | Huisman | G01R 31/31725 702/117 |
| 2003/0182604 A1* | 9/2003 | Hathaway | G01R 31/318536 714/715 |
| 2003/0229834 A1 | 12/2003 | Cooke | |
| 2007/0061621 A1* | 3/2007 | Bae | G01R 31/318572 714/25 |
| 2007/0143651 A1 | 6/2007 | Kiryu | |
| 2008/0222464 A1* | 9/2008 | Gorman | G11C 29/40 714/718 |
| 2008/0256497 A1 | 10/2008 | Wohl et al. | |
| 2008/0284453 A1* | 11/2008 | Swenton | G01R 31/31813 324/750.23 |
| 2009/0089637 A1* | 4/2009 | Jun | G01R 31/318536 714/729 |
| 2009/0217115 A1* | 8/2009 | Berry | G01R 31/318536 714/728 |
| 2009/0254786 A1* | 10/2009 | Cheng | G01R 31/31813 714/729 |
| 2009/0259898 A1* | 10/2009 | Wen | G01R 31/3183 714/726 |
| 2010/0017668 A1* | 1/2010 | Pichamuthu | G01R 31/318385 714/738 |
| 2014/0298128 A1* | 10/2014 | Maliuk | G01R 31/318541 714/731 |
| 2015/0253382 A1 | 9/2015 | Douskey et al. | |

* cited by examiner

IMPLEMENTING DECREASED SCAN DATA INTERDEPENDENCE FOR COMPRESSED PATTERNS IN ON PRODUCT MULTIPLE INPUT SIGNATURE REGISTER (OPMISR) THROUGH SCAN SKEWING

FIELD OF THE INVENTION

The present invention relates generally to the data processing field, and more particularly, relates to a method and circuit for implementing enhanced scan testing with decreased scan data interdependence for compressed patterns in on product multiple input signature register (OPMISR) testing through scan skewing, and a design structure on which the subject circuit resides.

DESCRIPTION OF THE RELATED ART

Circuits often are prone to defects introduced during a manufacturing process. To test for defects, a scan input may be applied to scan channels, and the result of the scan input that is applied to the scan channels may be analyzed. The test may include large numbers and variations of scan inputs being applied to scan channels of the circuit. Typically the tests take a great amount of time, produce large amounts of data for analysis, and require large amounts of resources for that analysis.

As Application Specific Integrated Circuit (ASIC) and Processor chips continue to get larger, test data volume and test time naturally increase as well. It continually becomes even more important to increase test efficiency. In typical scan pattern based tests, chips are tested by scanning data into every latch in the design through a narrow, usually 32-bit wide, scan-in port and triggering functional clock pulses. Then, data is scanned out through another narrow, usually 32-bit wide, scan-out port, where it is compared to pre-computed values.

There are a few different ways that this scan-in bus can be delivered to all parts of a chip. In the naïve approach, each of the 32 scan chains contain 1/32nd of the total logic of the chip. This works and allows for the most unique data in each scan cycle, but it takes a lot of data volume to make this possible. Plus, test tend to require a lot of time since the entire chip is scanned in and out in each test iteration.

Alternatively, the 32-bit scan-in bus can be delivered in parallel to many parts of the chip (usually through a fan-out network feeding many channels, which in turn feed a section of logic on the chip) at once. Typically when this is accompanied with a Multiple Input Signature Register (MISR) for an on-chip data compression this is called On Product Multiple Input Signature Register (OPMISR). This reduces data volume, but can create an interdependence of data between channels that receive the same data. This can simply make some logic untestable or at least reduce fault coverage per cycle. This is because as each test targets a specific section of logic; feeding that same test data to other sections may not do as good a job of detecting faults there. As a result, more tests will be created to target faults in the second section of logic. So, test coverage per test pattern decreases, when compared with the fully independent scanned test data. While this seems to increase the number of tests required, the shortened scan segments used for this OPMISR test allow for an increased test count in the same data volume.

OPMISR designs often load identical data into multiple chiplets. While this significantly reduces data volume it could limit test coverage where common data initialization conflicts with a unique need for testing a structure. The server designs already have a way to separate some of this identical data with a chiplet select structure. This structure was created to allow multiple scan sectioned tests (loading data in one section while the others are held), as well as other individual loading purposes.

A need exists for implementing enhanced scan data testing with decreased scan data interdependence for compressed patterns in on product multiple input signature register (OPMISR) testing through scan skewing, and to improve both data volume compression and test coverage.

SUMMARY OF THE INVENTION

Principal aspects of the present invention are to provide a method and circuit for implementing enhanced scan data testing with decreased scan data interdependence for compressed patterns in on product multiple input signature register (OPMISR) testing through scan skewing, and a design structure on which the subject circuit resides. Other important aspects of the present invention are to provide such method, circuit and design structure substantially without negative effects and that overcome many of the disadvantages of prior art arrangements.

In brief, a method and circuit for implementing enhanced scan data testing with decreased scan data interdependence for compressed patterns in on product multiple input signature register (OPMISR) testing through scan skewing, and a design structure on which the subject circuit resides. The circuit is divided into multiple chiplets. Each chiplet includes a stump mux structure including multiple stump muxes connected in series, and a respective chiplet select is provided on shared scan inputs to respective chiplets. The chiplet select gates scan clocks, and when a chiplet is not selected the chiplet retains its data. The chiplet select enables test data to be skewed as scan data enters each chiplet.

In accordance with features of the invention, the chiplet selected circuit provides a single pattern that otherwise would not have been creatable to be loaded with only a few extra scan clocks.

In accordance with features of the invention, the chiplet selected circuit allows better fitting of care bits for test compaction. For example, when two test pattern care bit locations conflict, rather than requiring a full new test, a small shift in loading one chiplet can allow the tests to be combined at a much smaller cost of only a few scan clocks.

In accordance with features of the invention, the chiplet selected circuit effectively and efficiently enables generating and combining test patterns.

In accordance with features of the invention, test patterns are generated by chiplet, then first combined within the same chiplet when care bits are not conflict.

In accordance with features of the invention, the chiplet selected circuit enables a smaller pattern set substantially without adding scan depth. Next the pattern sets are combined between chiplets again without conflicting care bits for no scan cycle additions.

In accordance with features of the invention, the chiplet selected circuit enables combining patterns with minimal conflicting care bits. This includes patterns of different chiplets, as conflicting care bits within a chiplet cannot be combined.

In accordance with features of the invention, the chiplet selected circuit enables a balance point to be reached for all patterns, and the patterns can be filled. Filling is either with random data or based on another criteria, like minimizing switching for the entire pattern to reduce noise or power.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing enhanced scan data testing with decreased scan data interdependence for compressed patterns in on product multiple input signature register (OPMISR) testing through scan skewing, and a design structure are provided.

Figure 1:
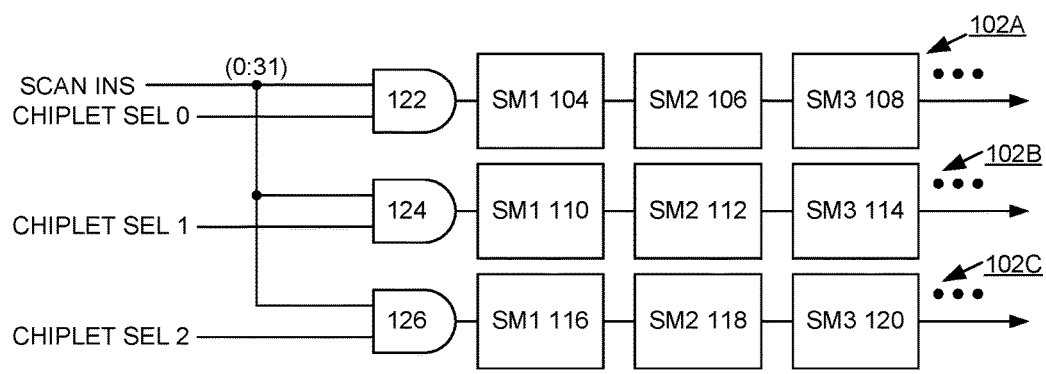
FIG. 1 is a schematic and block diagram representation illustrating an example circuit for implementing enhanced scan data testing with decreased scan data interdependence for compressed patterns in on product multiple input signature register (OPMISR) testing through scan skewing in accordance with preferred embodiments.

Having reference now to the drawings, in FIG. 1, there is shown an example circuit generally designated by the reference character 100 for implementing enhanced scan data testing with decreased scan data interdependence for compressed patterns in on product multiple input signature register (OPMISR) testing through scan skewing in accordance with preferred embodiments. Circuit 100 is an example chiplet selected circuit for implementing enhanced scan data testing of the invention.

Chiplet selected circuit 100 includes a plurality of chiplets generally designated by the reference character 102A, 102B, and 102C. As shown, each of the chiplets 102A, 102B, and 102C includes a stump mux structure respectively including a plurality of stump muxes SM1, SM2, SM3, 104, 106, 108; 110, 112, 114; 116, 118, 120, connected in series or in a daisy chain. Each chiplet includes a respective chiplet select CHIPLET SEL 0, CHIPLET SEL 1, CHIPLET SEL 2 applied via a respective AND gate 122, 124, 126 provided with shared scan inputs SCAN INS (0:31) applied to different chiplets 102A, 102B, and 102C. The chiplet selects, CHIPLET SEL 0, CHIPLET SEL 1, CHIPLET SEL 2, gate scan clocks, so when a chiplet is not selected the chiplet retains its data. The chiplet selects, CHIPLET SEL 0, CHIPLET SEL 1, CHIPLET SEL 2, enable test data to be skewed as the test data enters each chiplet.

In accordance with features of the invention, the chiplet selects in circuit 100 allow a single pattern that otherwise would not have been creatable to be loaded with only a few extra scan clocks. The chiplet selects also allow for better fitting of care bits for test compaction. It is possible that when two test pattern care bit locations conflict, rather than requiring a full new test, a small shift in loading one chiplet can allow the test to be combined at a much smaller cost of only a few scan clocks.

Figure 2:
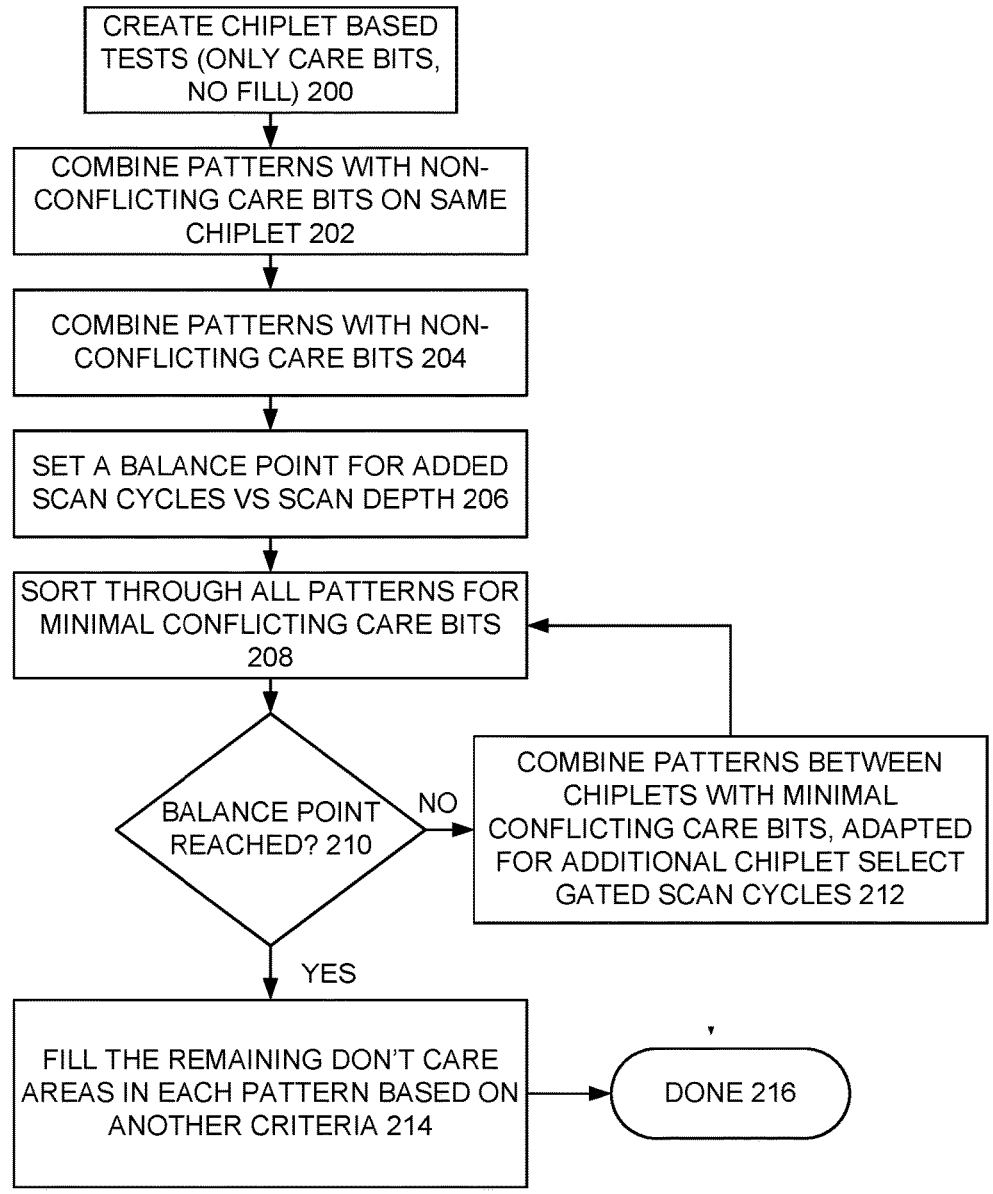
FIG. 2 is a flow chart illustrating example operation for generating and combining test patterns in a chiplet selected circuit of FIG. 1 in accordance with preferred embodiments.

Referring now to FIG. 2, there are shown example operations for generating and combining test patterns, for example in chiplet selected circuit 100 in accordance with preferred embodiments. As indicated at a block 200, chiplet based tests are created, for example, including only care bits, no fill. Note that the patterns are generated by chiplet, then first combined within the same chiplet when care bits are not conflicting (block 202). This produces a smaller pattern set without adding scan depth. Next as indicated at a block 204, the patterns are combined across chiplets without conflicting care. This will by nature be patterns that are of different chiplets, as conflicting care bits within a chiplet cannot be combined. A balance point for added scan cycles versus scan depth is set as indicated at a block 206. Sorting through all patterns for minimal conflicting care bits is performed as indicated at a block 208. Checking for a balance point reached is performed as indicated at a decision block 210. If a balance point is not reached for all patterns, then patterns are combined between chiplets with minimal conflicting care bits, adapted for additional chiplet select gated scan cycles as indicated at a block 212. Finally a balance point is reached for all patterns, and the patterns can be filled. As indicated at a block 214, filling is either with random data or based on another criteria, such as minimizing switching for the entire pattern to reduce noise or power. Operations are completed as indicated at a block 216.

Figure 3:
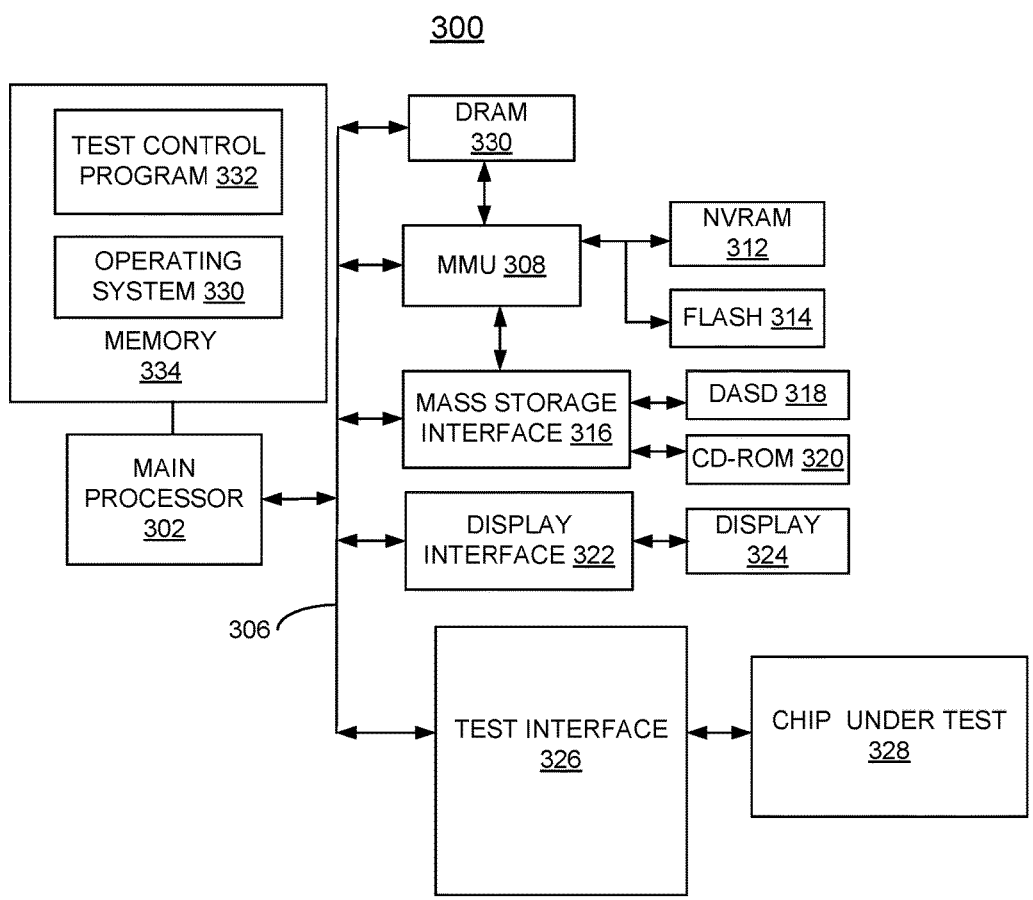
FIG. 3 is a block diagram representation illustrating an exemplary computer test system for implementing a method for providing enhanced scan data testing with decreased scan data interdependence with on product multiple input signature register (OPMISR) testing in accordance with preferred embodiments.

Referring now to FIG. 3, there is shown an exemplary computer test system for implementing enhanced scan data testing for decreased scan data interdependence with on product multiple input signature register (OPMISR+) testing generally designated by the reference character 300 in accordance with the preferred embodiment. Computer system 300 includes a main processor 302 or central processor unit (CPU) 302 coupled by a system bus 306 to a memory management unit (MMU) 308 and system memory including a dynamic random access memory (DRAM) 330, a nonvolatile random access memory (NVRAM) 312, and a flash memory 314. A mass storage interface 316 coupled to the system bus 306 and MMU 308 connects a direct access storage device (DASD) 318 and a CD-ROM drive 320 to the main processor 302. Computer system 300 includes a display interface 322 connected to a display 324, and a test interface 326 coupled to the system bus 306. An integrated circuit device or chip under test 328 is coupled to the test interface 326. Computer system 300 includes an operating system 330, and a test control program 332 of the preferred embodiment resident in a memory 334.

Figure 4:
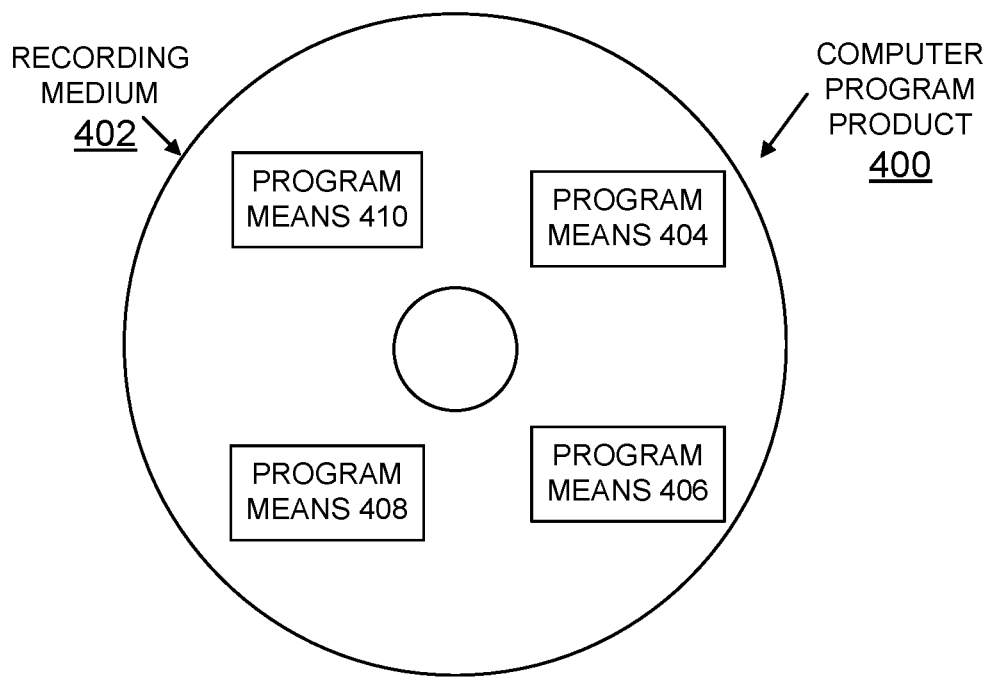
FIG. 4 is a block diagram illustrating a computer program product in accordance with the preferred embodiments.

Computer test system 300 is shown in simplified form sufficient for understanding the present invention. The illustrated computer test system 300 is not intended to imply architectural or functional limitations. The present invention can be used with various hardware implementations and systems and various other internal hardware devices, for example, multiple main processors Referring now to FIG. 4, an article of manufacture or a computer program product 400 of the invention is illustrated. The computer program product 400 includes a recording medium 402, such as, a floppy disk, a high capacity read only memory in the form of an optically read compact disk or CD-ROM, a tape, or another similar computer program product. Recording medium 402 stores program means 404, 406, 408, and 410 on the medium 402 for carrying out the methods for implementing scan testing diagnostics of the preferred embodiment with the example circuit of FIG. 1 and the system 300 of FIG. 3.

A sequence of program instructions or a logical assembly of one or more interrelated modules defined by the recorded program means 404, 406, 408, and 410, direct the computer system 300 for implementing scan testing diagnostics of the preferred embodiment.

Figure 5:
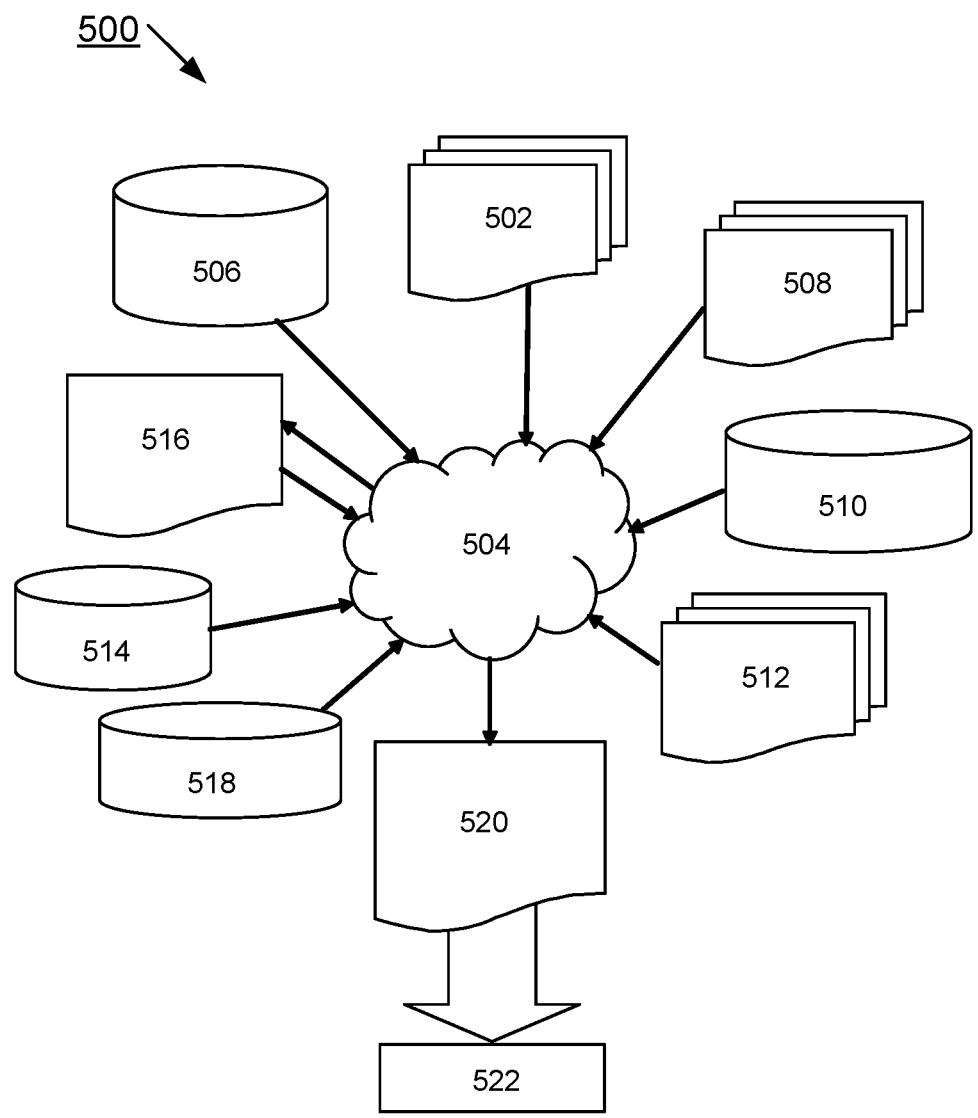
FIG. 5 is a flow diagram of a design process used in semiconductor design, manufacturing, and/or test.

FIG. 5 shows a block diagram of an example design flow 500. Design flow 500 may vary depending on the type of IC being designed. For example, a design flow 500 for building an application specific IC (ASIC) may differ from a design flow 500 for designing a standard component. Design structure 502 is preferably an input to a design process 504 and may come from an IP provider, a core developer, or other design company or may be generated by the operator of the design flow, or from other sources. Design structure 502 comprises circuit 100 in the form of schematics or HDL, a hardware-description language, for example, Verilog, VHDL, C, and the like. Design structure 502 may be contained on one or more machine readable medium. For example, design structure 502 may be a text file or a graphical representation of circuit 100. Design process 504 preferably synthesizes, or translates, circuit 100 into a netlist 506, where netlist 506 is, for example, a list of wires, transistors, logic gates, control circuits, I/O, models, etc. that describes the connections to other elements and circuits in an integrated circuit design and recorded on at least one of machine readable medium. This may be an iterative process in which netlist 506 is resynthesized one or more times depending on design specifications and parameters for the circuit.

Design process 504 may include using a variety of inputs; for example, inputs from library elements 508 which may house a set of commonly used elements, circuits, and devices, including models, layouts, and symbolic representations, for a given manufacturing technology, such as different technology nodes, 32 nm, 45 nm, 50 nm, and the like, design specifications 510, characterization data 512, verification data 514, design rules 516, and test data files 518, which may include test patterns and other testing information. Design process 504 may further include, for example, standard circuit design processes such as timing analysis, verification, design rule checking, place and route operations, and the like. One of ordinary skill in the art of integrated circuit design can appreciate the extent of possible electronic design automation tools and applications used in design process 504 without deviating from the scope and spirit of the invention. The design structure of the invention is not limited to any specific design flow.

Design process 504 preferably translates an embodiment of the invention as shown in FIGS. 1, and 2 along with any additional integrated circuit design or data (if applicable), into a second design structure 520. Design structure 520 resides on a storage medium in a data format used for the exchange of layout data of integrated circuits, for example, information stored in a GDSII (GDS2), GL1, OASIS, or any other suitable format for storing such design structures. Design structure 520 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, and 2. Design structure 520 may then proceed to a stage 522 where, for example, design structure 520 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing enhanced scan data testing with decreased scan data interdependence for compressed patterns in on product multiple input signature register (OPMISR) testing through scan skewing, said circuit comprising:
a plurality of chiplets;
each chiplet including a stump mux structure including a plurality of stump muxes connected in series, and
a respective chiplet select providing shared scan inputs to respective chiplets; said respective chiplet select selecting a selected chiplet of said plurality of chiplets and gating scan clocks to respective chiplets, wherein a respective chiplet not selected retains its data; and the chiplet select enabling test data to be skewed as scan data enters each chiplet; and said shared scan inputs receiving only care bits, no fill for creating chiplet based tests, generating test patterns by the selected chiplet and combining test patterns within the selected chiplet when care bits are not conflicting to produce a test pattern set and producing the test pattern set without adding scan depth, and combining patterns across respective chiplets with non-conflicting care bits, the chiplet select enabling combining a test when two test pattern care bit locations conflict with a shift in loading one chiplet, and enabling enhanced scan data testing with decreased scan data interdependence for compressed patterns.

2. The circuit as recited in claim 1, wherein said circuit provides a single pattern to be loaded with minimal added scan clocks.

3. The circuit as recited in claim 1, wherein said circuit provides enhanced fitting of care bits for test compaction.

4. The circuit as recited in claim 1, wherein said a shift in loading one chiplet for combining two test patterns with care bit location conflicts requires minimal extra scan clocks.

5. The circuit as recited in claim 1, wherein said circuit provides said pattern set substantially without adding scan depth.

6. The circuit as recited in claim 1, wherein said circuit enables a balance point to be reached for all patterns, and filling the patterns based on a selected criteria.

7. A design structure embodied in a non-transitory machine readable medium for designing, manufacturing, and testing an integrated circuit, the design structure comprising:

a circuit tangibly embodied in the non-transitory machine readable medium used in a design process, said circuit for implementing enhanced scan data testing with decreased scan data interdependence for compressed patterns in on product multiple input signature register (OPMISR) testing through scan skewing, said circuit comprising:

a plurality of chiplets;

each chiplet including a stump mux structure including a plurality of stump muxes connected in series, and a respective chiplet select providing shared scan inputs to respective chiplets; said respective chiplet select selecting a selected chiplet of said plurality of chiplets and gating scan clocks to respective chiplets, wherein a respective chiplet not selected retains its data; and the chiplet select enabling test data to be skewed as scan data enters each chiplet; and said shared scan inputs receiving only care bits, no fill for creating chiplet based tests, generating test patterns by the selected chiplet and combining test patterns within the selected chiplet when care bits are not conflicting to produce a test pattern set and producing the test pattern set without adding scan depth, and combining patterns across respective chiplets with non-conflicting care bits, the chiplet select enabling combining a test when two test pattern care bit locations conflict with a shift in loading one chiplet, and enabling enhanced scan data testing with decreased scan data interdependence for compressed patterns, when read and used in the manufacture of a semiconductor chip produces a chip comprising said circuit.

8. The design structure of claim 7, wherein the design structure comprises a netlist, which describes said circuit.

9. The design structure of claim 7, wherein the design structure resides on storage medium as a data format used for the exchange of layout data of integrated circuits.

10. The design structure of claim 7, wherein the design structure includes at least one of test data files, characterization data, verification data, or design specifications.

11. The design structure of claim 7, wherein said circuit provides a single pattern to be loaded with minimal added scan clocks.

12. The design structure of claim 7, wherein said circuit provides enhanced fitting of care bits for test compaction.

13. The design structure of claim 7, wherein said shift in loading one chiplet for combining two test patterns with care bit locations conflict requires minimal extra scan clocks.

14. The design structure of claim 7, wherein said circuit provides said pattern set substantially without adding scan depth.

15. The design structure of claim 7, wherein said circuit enables a balance point to be reached for all patterns, and filling the patterns based on a selected criteria to minimize power.

16. A method for implementing enhanced scan data testing with decreased scan data interdependence for compressed patterns in on product multiple input signature register (OPMISR) testing through scan skewing, said method comprising:

providing a circuit with a plurality of chiplets;

providing each chiplet with a stump mux structure including a plurality of stump muxes connected in series, and providing a respective chiplet select providing shared scan inputs to respective chiplets; said respective chiplet select selecting a selected chiplet of said plurality of chiplets and gating scan clocks for a chiplet not selected for retaining its data; and the chiplet select enabling test data to be skewed as scan data enters each chiplet; and said shared scan inputs receiving only care bits, no fill for creating chiplet based tests, generating test patterns by the selected chiplet and combining test patterns within the selected chiplet when care bits are not conflicting to produce a test pattern set and producing the test pattern set without adding scan depth, and combining patterns across respective chiplets with non-conflicting care bits, the chiplet select enabling combining a test when two test pattern care bit locations conflict with a shift in loading one chiplet, and enabling enhanced scan data testing with decreased scan data interdependence for compressed patterns.

17. The method as recited in claim 16 wherein said shift in loading one chiplet for combining two test patterns with care bit locations conflict requires minimal extra scan clocks.

18. The method as recited in claim 16 includes providing a single pattern to be loaded with minimal added scan clocks, using respective chiplet select.

19. The method as recited in claim 16 includes providing a balance point to be reached for all patterns, and filling the patterns based upon a predefined criteria to minimize noise.

20. The method as recited in claim 16 includes providing enhanced fitting of care bits for test compaction.

* * * * *